(12) United States Patent
Bauer et al.

(10) Patent No.: US 11,079,410 B2
(45) Date of Patent: Aug. 3, 2021

(54) CONSTRUCTIVE SYSTEM REGARDING A CAPACITIVE SENSOR

(71) Applicant: G & W Electric Company, Bolingbrook, IL (US)

(72) Inventors: Alberto Bauer, Dubai (AE); Lorenzo Peretto, Rovigo (IT)

(73) Assignee: G & W Electric Company, Bolingbrook, IL (US)

(*) Notice: Subject to any disclaimer, the term of this patent is extended or adjusted under 35 U.S.C. 154(b) by 105 days.

(21) Appl. No.: 16/498,090

(22) PCT Filed: Mar. 16, 2018

(86) PCT No.: PCT/IT2018/000037
§ 371 (c)(1),
(2) Date: Sep. 26, 2019

(87) PCT Pub. No.: WO2018/179017
PCT Pub. Date: Oct. 4, 2018

(65) Prior Publication Data
US 2020/0256896 A1      Aug. 13, 2020

(30) Foreign Application Priority Data
Mar. 27, 2017   (IT) .................. 102017000033017

(51) Int. Cl.
*G01R 15/16* (2006.01)
*G01R 19/00* (2006.01)
*G01R 15/14* (2006.01)

(52) U.S. Cl.
CPC .......... *G01R 15/16* (2013.01); *G01R 15/165* (2013.01); *G01R 19/0084* (2013.01); *G01R 15/142* (2013.01); *G01R 19/0092* (2013.01)

(58) Field of Classification Search
CPC .............. G01R 19/00; G01R 19/0084; G01R 19/0092; G01R 15/00; G01R 15/12;
(Continued)

(56) References Cited

U.S. PATENT DOCUMENTS 3,835,353 A * 9/1974 Hermstein ............ G01R 15/16
361/328
4,241,373 A * 12/1980 Mara ..................... G01R 15/142
324/126

(Continued)

FOREIGN PATENT DOCUMENTS

| CN | 105588966 A | 5/2016 |
| WO | 2010070693 A1 | 6/2010 |
| WO | 2018179017 A1 | 10/2018 |

OTHER PUBLICATIONS

Italian Patent Office Action and Search Report for Application No. 10201700003017 dated Jan. 17, 2018 (9 pages).
(Continued)

*Primary Examiner* — Hoai-An D. Nguyen
(74) *Attorney, Agent, or Firm* — Michael Best & Friedrich LLP

(57) ABSTRACT

A construction system regarding a capacitive voltage sensor, comprises a source electrode (110/210/310/410), a tubular body (120/220/320/420), and a mass of dielectric insulating material (140/240/340/440). The tubular body (120/220/320/420) comprises: a self-supporting tubular laminar element (123/223/323/423) made of insulating material, in which the self-supporting tubular laminar element (123/223/323/423) is stretched to form the support structure for said tubular body (120/220/320/420); a first thin layer (124/224/324/424) of conductive material applied to the outer surface of said self-supporting tubular laminar element (123/223/323/423), wherein said first thin layer (124/224/324/424) of conductive material is intended to perform the function of an
(Continued)

electric screen; a second thin layer (125/225/325/425) of conductive material applied to the inner surface of said self-supporting tubular laminar element (123/223/323/423), wherein said second thin layer (125/225/325/425) of conductive material is designed to form an armature for a capacitive coupling.

16 Claims, 9 Drawing Sheets

(58) Field of Classification Search
CPC .... G01R 15/14; G01R 15/142; G01R 15/144; G01R 15/146; G01R 15/16; G01R 15/165; G01R 27/00; G01R 27/02; G01R 27/08
USPC ...... 324/76.11, 126, 522, 713; 702/1, 57, 64
See application file for complete search history.

(56) References Cited

U.S. PATENT DOCUMENTS

| | | | |
|---|---|---|---|
| 6,252,388 B1 | 6/2001 | Jaeger et al. | |
| 8,847,353 B2* | 9/2014 | Hasunuma | H01L 27/10897 257/532 |
| 9,118,330 B2* | 8/2015 | Beyly | G06F 3/04166 |
| 9,921,246 B2* | 3/2018 | Bauer | B29C 39/003 |
| 2011/0121820 A1* | 5/2011 | Handshoe | G01R 27/2605 324/126 |
| 2011/0121842 A1 | 5/2011 | Bauer et al. | |
| 2011/0205683 A1 | 8/2011 | Peretto | |
| 2011/0234311 A1* | 9/2011 | Hirashiki | G01R 19/0092 327/581 |
| 2011/0298454 A1 | 12/2011 | Ausserlechner | |
| 2012/0261384 A1* | 10/2012 | LaBianco | H01H 33/027 218/118 |
| 2014/0300374 A1* | 10/2014 | McKenzie | G01R 19/0084 324/658 |
| 2016/0005511 A1 | 1/2016 | Gravermann et al. | |
| 2016/0245845 A1 | 8/2016 | Alberto | |
| 2017/0038414 A1 | 2/2017 | Barba Jimenez | |
| 2017/0067938 A1* | 3/2017 | Kasai | G01R 1/06788 |
| 2019/0234995 A1* | 8/2019 | Peretto | G01R 15/165 |

OTHER PUBLICATIONS

International Search Report and Written Opinion for International Application No. PCT/IT2018/000037 dated Jul. 17, 2018 (9 pages).
International Search Report and Written Opinion for International Application No. PCT/IT2017/000225 dated Apr. 5, 2018 (11 pages).

* cited by examiner

CONSTRUCTIVE SYSTEM REGARDING A CAPACITIVE SENSOR

FIELD OF INVENTION

The present invention relates to a construction system regarding a capacitive voltage sensor, in which said sensor detects the electric field generated by a voltage element of the same capacitive sensor, in order, for example, to determine the value of the voltage of said live element.

More particularly, the present invention relates to a construction system regarding a capacitive voltage sensor, wherein said sensor provides to detect the electric field generated by the voltage element of the same sensor without being influenced by any surrounding electric and/or magnetic fields, as, for example, the electric/magnetic fields generated by other conductors and/or other bars arranged nearby.

BACKGROUND OF THE INVENTION

At the present, the capacitive voltage sensors have a series of drawbacks.

A first drawback is due to the fact that the dielectric material resin disposed around the components of the sensor includes vacuoles (air bubbles) with consequent phenomena of unwanted partial discharges.

A second drawback is due to the fact that the same resin is detached with respect to the elements that make up the capacitive sensor with consequent phenomena of unwanted partial discharges.

A third drawback is due to the fact that the aforementioned resin is not perfectly adherent and/or not perfectly clinging and/or constrained with respect to the components that make up the capacitive sensor and, therefore, as a result of aging, detachments occur between said resin and the aforementioned organs, with consequent phenomena of unwanted partial discharges. This problem is particularly present when the capacitive sensor is used in an environment in which the operating temperature (hot/cold) varies cyclically.

A fourth drawback is due to the fact that the components forming the sensors are expensive to carry out.

A fifth drawback is due to the fact that the components forming the sensors after their correct positioning can move during the subsequent assembly or transport operations which take place before the casting of the resin, with consequent realization of a non-conforming product and/or a product to be discarded.

A sixth disadvantage is due to the fact that the correctly positioned components forming the sensors can move during the casting and solidification operations of the resin, with consequent realization of a non-conforming and/or to be rejected product.

EXPOSURE OF THE INVENTION

The purpose of the present invention is therefore to solve the aforementioned drawbacks.

The invention, which is characterized by the claims, solves the problem of creating a constructive system regarding a capacitive sensor of electric voltage, wherein said system extends axially along a defined longitudinal axis, wherein said system is characterized in that it comprises: a source electrode, wherein said source electrode has an elongated shape extending longitudinally along a longitudinal axis, wherein said source electrode configures a first axial portion defined proximal and a second axial portion defined distal opposite to the first axial portion; a tubular body, in which said tubular body has an elongated shape extending longitudinally along a longitudinal axis, wherein said tubular body is positioned around said source electrode, wherein said tubular body configures a first axial portion defined proximal and a second axial portion defined as distal opposite to said first axial portion; a mass of dielectric insulating material, wherein said mass is designed to incorporate said source electrode and said tubular body; and in that said tubular body comprises: a self-supporting tubular laminar element made of insulating material, wherein said self-supporting tubular laminar element is designed to form the support structure for said tubular body; a first thin layer of conductive material applied to the outer surface of said self-supporting tubular laminar element, wherein said first thin layer of conductive material is designed to perform the electrical shield function; a second thin layer of conductive material applied to the inner surface of said self-supporting tubular laminar element, wherein said second thin layer of conductive material is able to form an armature for a capacitive coupling.

BRIEF DESCRIPTION OF THE DRAWINGS

Further features and advantages of the present invention will be more evident from the following description of some of its preferred practical embodiments, given here purely by way of non-limiting example, made with reference to the accompanying drawings, in which.

EXEMPLARY DESCRIPTION OF PREFERRED EMBODIMENT

Figure 1:
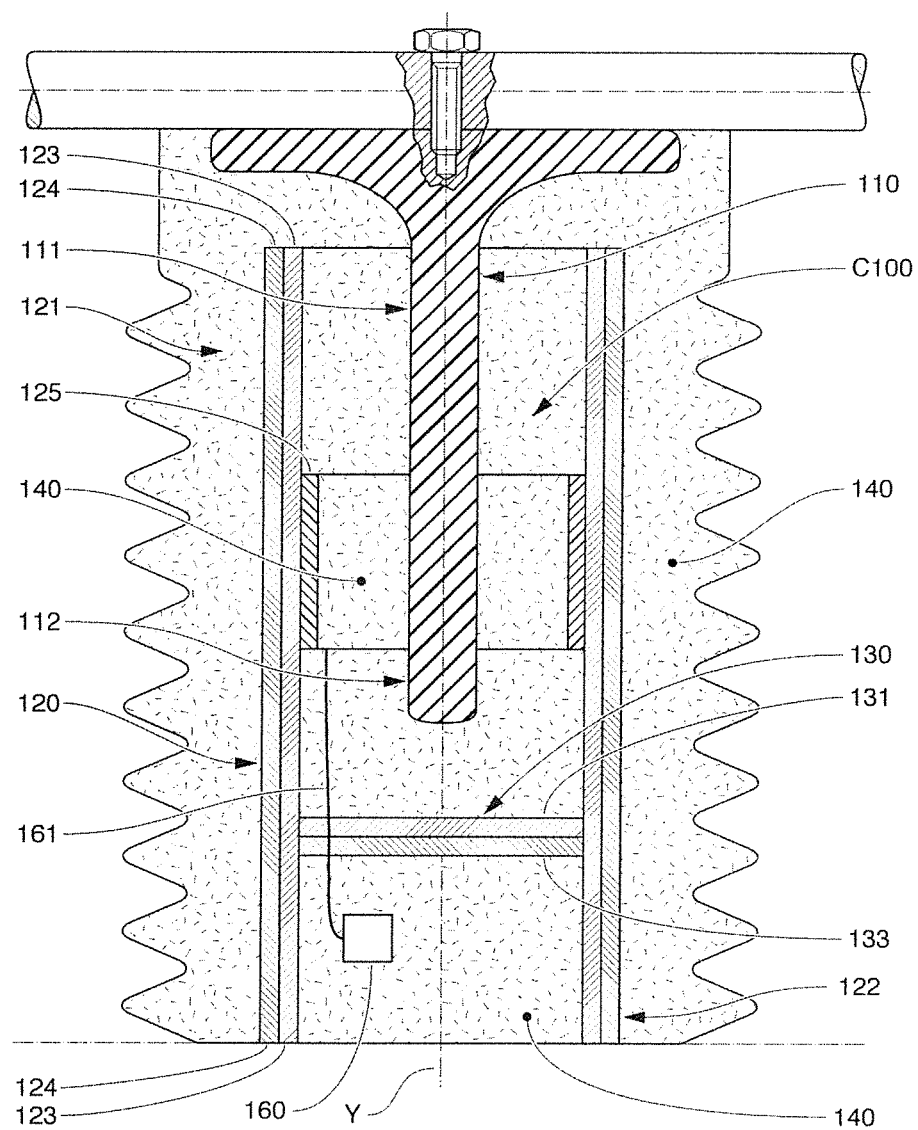
FIG. 1 illustrates a first embodiment of the construction system object of the present invention.

With reference to the attached figures, the construction system object of the present invention is able to provide a capacitive electric voltage sensor, wherein said system extends along a longitudinal axis Y, wherein said system comprises: a source electrode 110/210/310/410, a tubular body 120/220/320/420, a mass of dielectric insulating material 140/240/340/440.

With reference to said source electrode 110/210/310/410, it preferably has an elongated shape which extends longitudinally along a longitudinal axis Y and configures a first axial portion, 111/211/311/411, defined proximal, and a second axial portion, 112/212/312/412, defined distal and opposite with respect to the first axial portion 111/211/311/411.

With reference to the tubular body 120/220/320/420, it has an elongated shape extending longitudinally along the aforementioned longitudinal axis Y and it is positioned in a radially spaced manner around said source electrode 110/210/310/410.

Said tubular body 120/220/320/420 configures a first axial portion 121/221/321/421, defined proximal, and a second axial portion, 122/222/322/422, defined distal and opposite with respect to said first axial portion 121/221/321/421.

With reference to the mass of dielectric insulating material, 140/240/340/440, it is able to incorporate said source electrode 110/210/310/410 and said tubular body 120/220/320/420, as well as to position said elements and form a supporting structure.

With particular reference to said tubular body 120/220/320/420 it comprises: a self-supporting tubular laminar element 123/223/323/423, a first thin layer 124/224/324/424 of conductive material, and a second thin layer 125/225/325/425 of conductive material.

With reference to said self-supporting tubular laminating element 123/223/323/423 it is designed to form the support structure for said tubular body 120/220/320/420 and, preferably, it is made by an electrical or dielectric insulator, as for example of fiberglass (vetronite) or other similar material.

With reference to the first thin layer 124/224/324/424 of conductive material applied to the outer surface of said self-supporting tubular laminar element 123/223/323/423, it is designed to perform the electrical shield function and it is grounded.

Particularly, said first thin layer 124/224/324/424 is preferably obtained by applying a layer of copper or other conductive material over said self-supporting tubular laminar element 123/223/323/423, or by using a preformed base of double or single coppered face (coppery glassonite) as better understood later.

In this context, said first thin layer 124/224/324/424 of conductive material can take different dimensions, shapes and positions with respect to those illustrated in the figures of the attached drawings without departing from the inventive concepts protected by the present invention.

With reference to the second thin layer 125/225/325/425 of conductive material applied on the inner surface of said self-bearing tubular laminar element 123/223/323/423, it is designed to form an electric field sensor and, more particularly, an armature for a capacitive coupling between said source electrode 110/210/310/410 and said second thin layer 125/225/325/425.

In this context, said second thin layer 125/225/325/425 of conductive material can take different dimensions, shapes and positions with respect to those shown in the figures of the attached drawings without departing from the inventive concepts protected by the present invention.

With reference to said self-supporting tubular laminating element 123/223/323/423, said first thin layer 124/224/324/424 of conductive material applied to the outer surface of said self-supporting tubular laminar element 123/223/323/423, and to said second thin layer 125/225/325/425, they configure a first internal chamber C100, C200, C300, C400, wherein within said first internal chamber C100, C200, C300, C400 the source electrode 110/210/310/410 is positioned.

With reference to FIGS. 1, 1A, 2 and 2A, said tubular body 120/220 further comprises a septum 130/230.

Figure 1A:
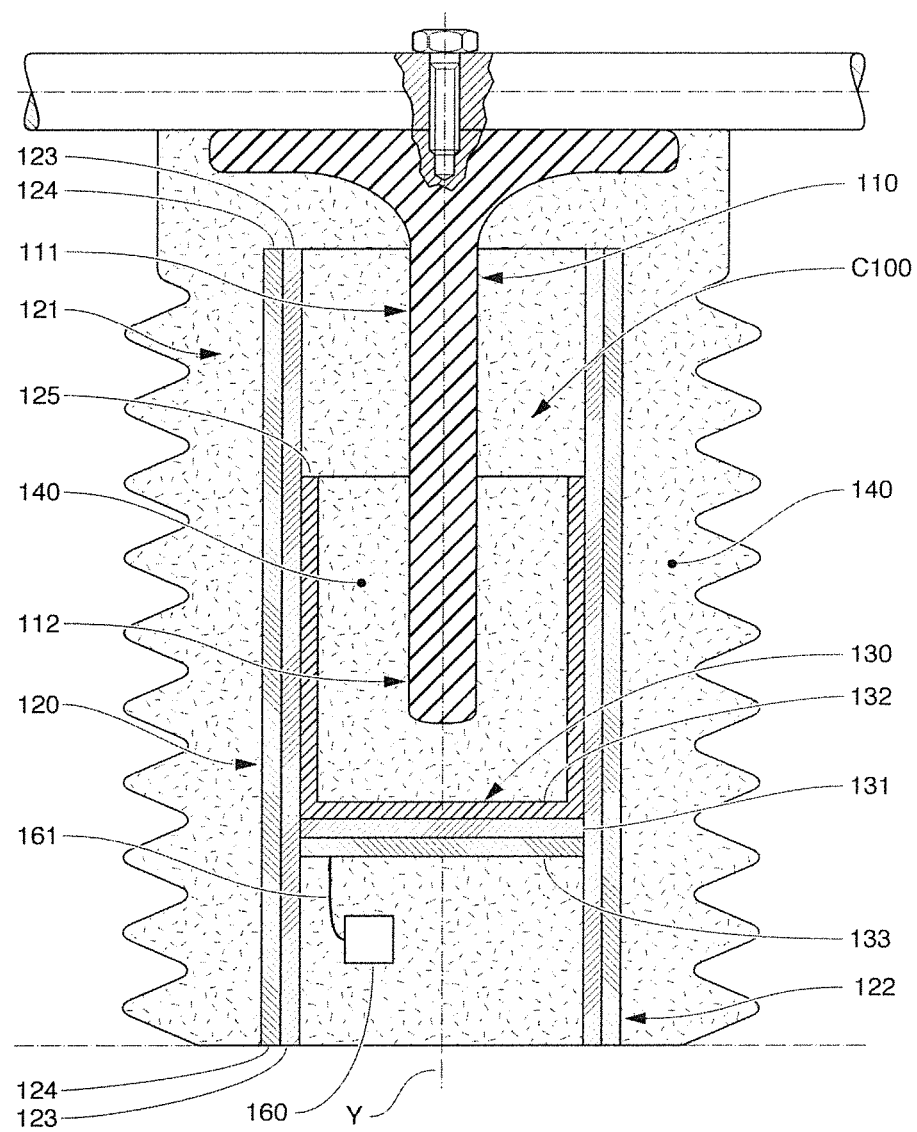
FIG. 1A illustrates a variant embodiment of the first embodiment of the construction system object of the present invention.
Figure 2:
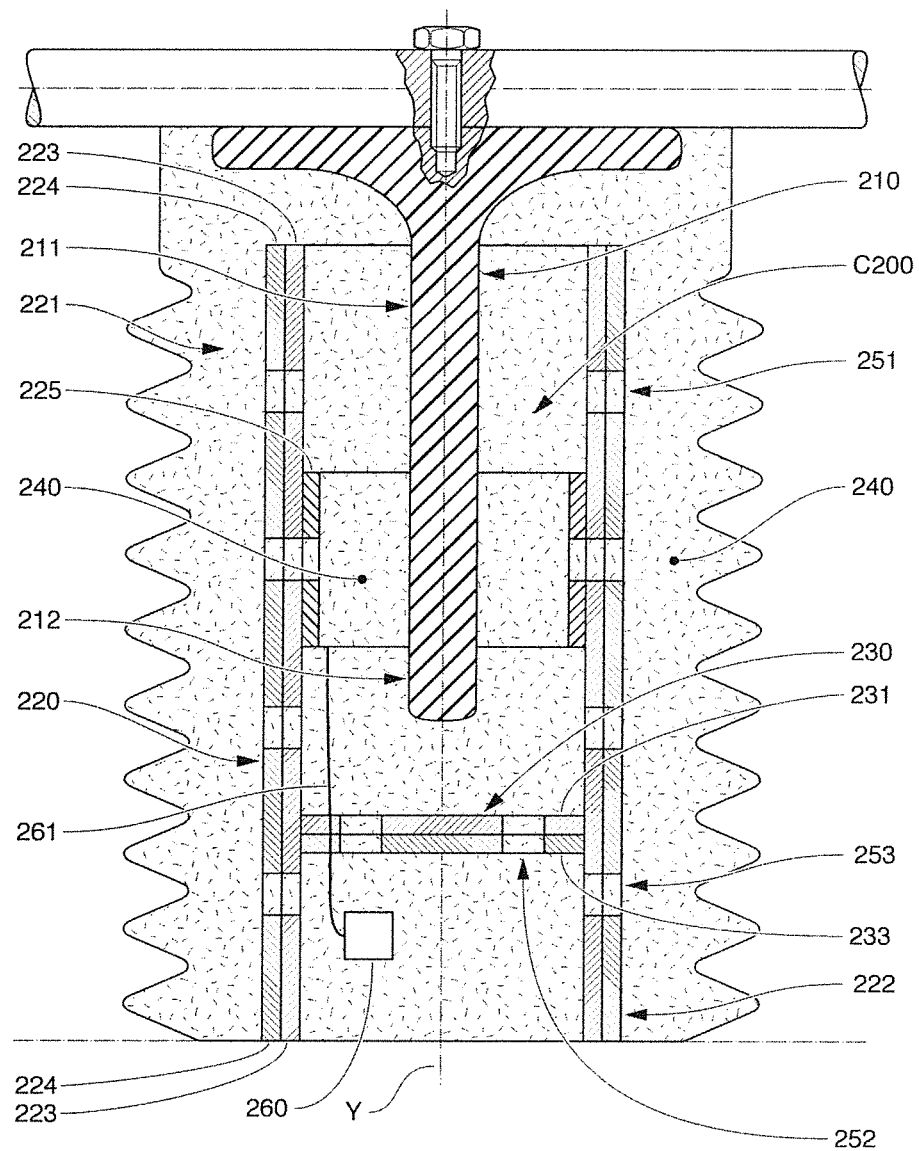
FIG. 2 illustrates a second embodiment of the construction system object of the present invention similar to the embodiment of FIG. 1.
Figure 2A:
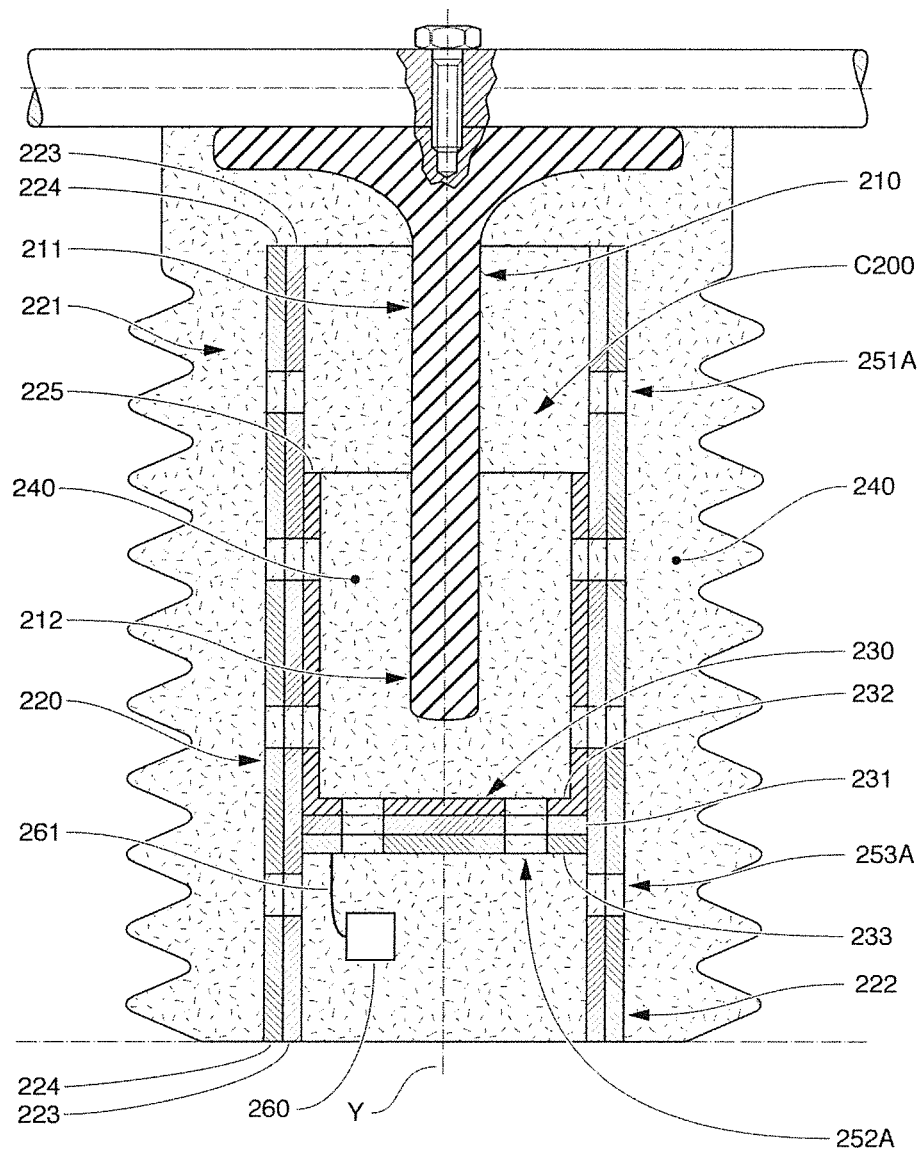
FIG. 2A illustrates a variant of embodiment of the second embodiment of the construction system object of the present invention.
Figure 3:
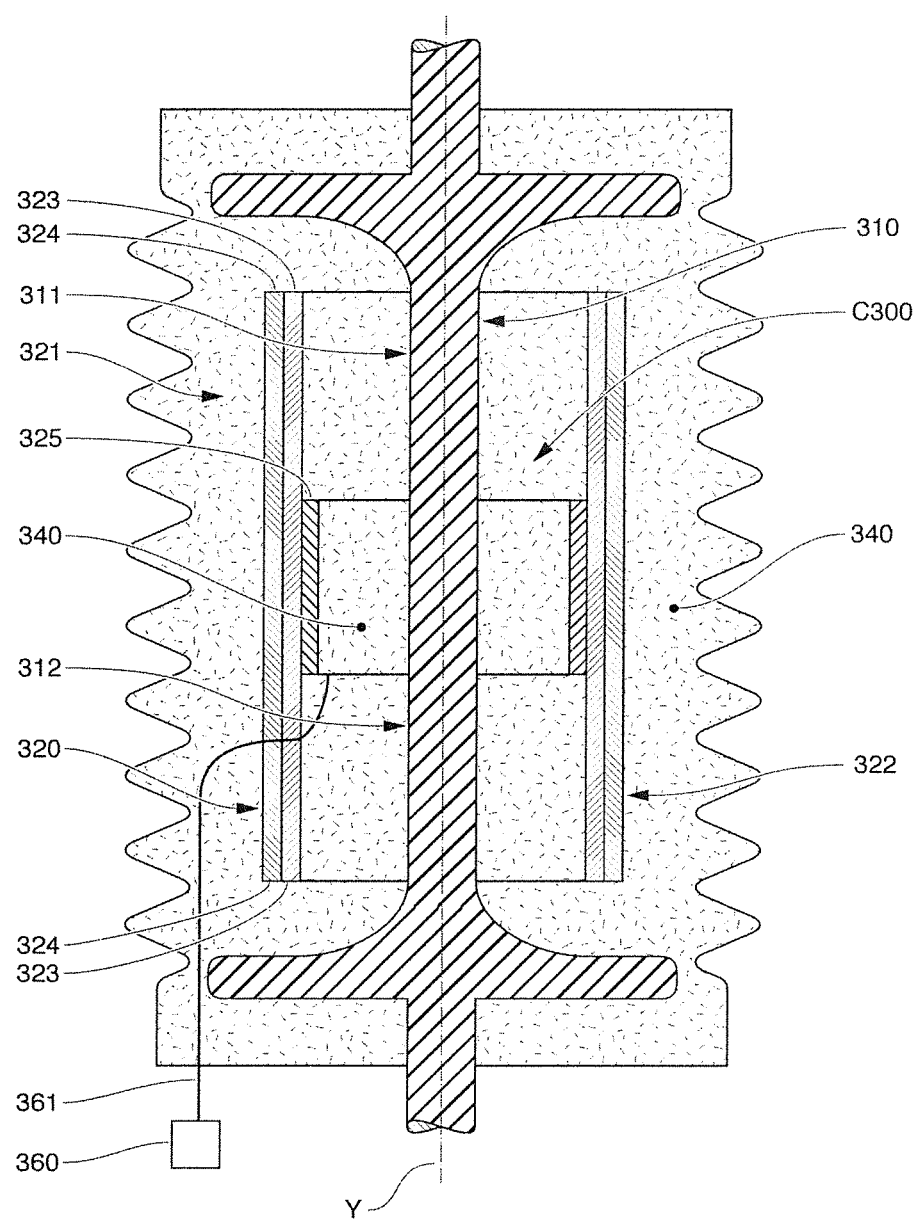
FIG. 3 illustrates a third embodiment of the construction system object of the present invention.

With reference to FIGS. 1A and 2A, said septum 130/230 comprises a second self-supporting lamina, 131/231, made of insulating material (eg fiberglass) having self-supporting structure/thickness, wherein said second self-supporting lamina 131/231 is able to form the support structure for said septum 130/230, wherein said second self-bearing lamina 131/231 configures a proximal face and a distal face, as well as a third thin layer 132/232 of conductive material applied on the proximal surface of said second self-supporting lamina 131/231.

Again with reference to the two FIGS. 1A and 2A, said second thin layer 125/225 of conductive material, applied on the inner surface of said self-supporting tubular lamina element 123/223, and said third thin layer 132/232 of conductive material applied on the proximal surface of said second self-bearing lamina 131/231, they form a first box-like body having a cup-like shape, 125_132/225_232, in which said cup has an opening facing towards the proximal portion of the system, wherein inside said first box-like body or cup 125_132/225_232 the distal portion 112/212 of the source electrode 110/210 is placed, in order to form a capacitive coupling between said source electrode 110/210 and said first box-like body or cup 125_132/225_232, in which the latter element acts as an electric field sensor.

With reference to FIGS. 1, 1A, 2 and 2A, said septum 130/230 comprises a second self-bearing lamina 131/231 made of insulating material (as described above) and a fourth thin layer 133/233 of conductive material applied on the distal surface of said second self-bearing foil 131/231, wherein said fourth thin layer 133/233 is connected to the ground.

In this embodiment, said first thin layer 124/224 of conductive material applied to the outer surface of said self-bearing tubular laminar element 123/223 and said fourth thin layer 133/233 of conductive material applied to the distal surface of said second self-supporting lamina 131/231 configure a second box-like element having a cup-like shape, in which said cup has the respective opening facing towards the distal portion of the system.

With reference to the above-described description, preferably, said tubular body 120/220 is made by means of a double-sided copper-plated base (fiberglass plate double-sided copper) wrapped in a tubular fashion, i.e., for example, by a fiberglass (vetronite) plate 123/223/323/423 having a first copper layer 124/224/324/424 applied on a first face of said lamina 123/223/323/423 and a second copper layer 125/225/325/425 applied on a second opposed face of the same lamina 123/223/323/423, wherein said first thin layer, 124/224/324/424, of conductive material is applied to the outer surface of said self-supporting tubular laminar element 123/223/323/423, and said second thin layer, 125/225/325/425, of conductive material is applied to the inner surface of said self-supporting tubular laminar element, 123/223/323/423, wherein said first and second layers are electrically insulated from each other.

Through Holes—FIGS. 2, 2A, 4, 6, 7_7A and 8_8A

Figure 4:
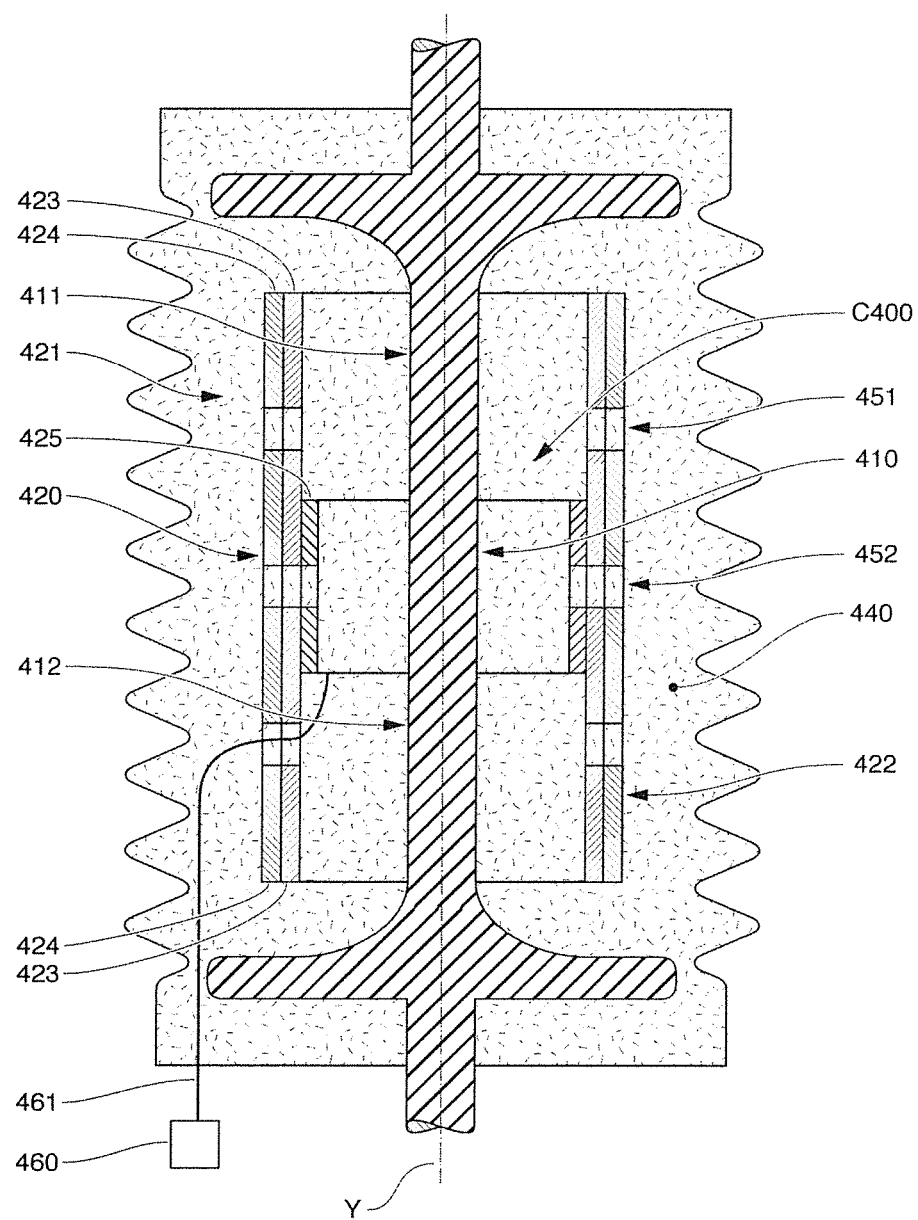
FIG. 4 shows a fourth embodiment of the construction system object of the present invention similar to the embodiment of FIG. 3.
Figure 5:
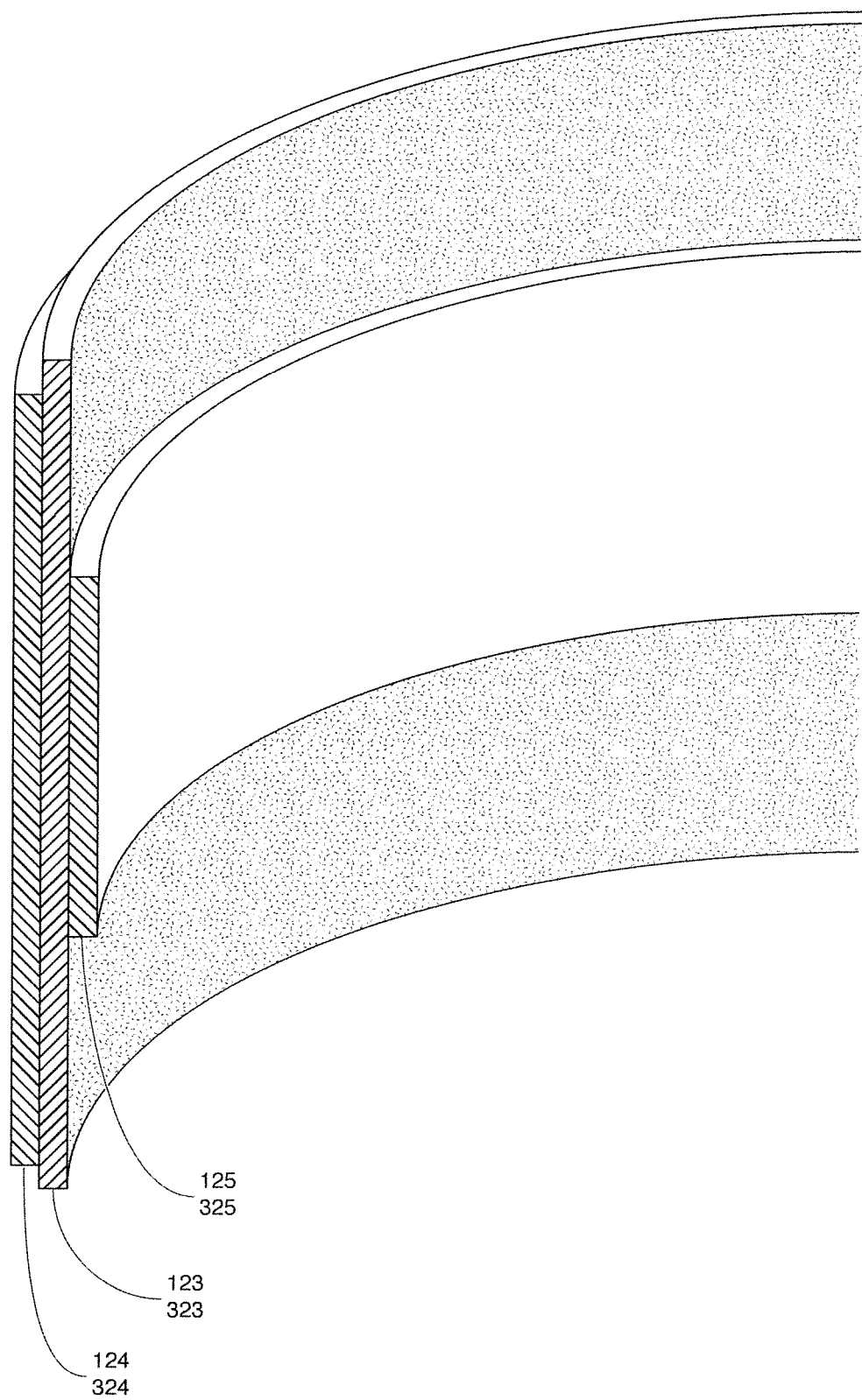
FIG. 5 illustrates a constructive detail concerning the realization of FIGS. 1, 1A and 3.
Figure 6:
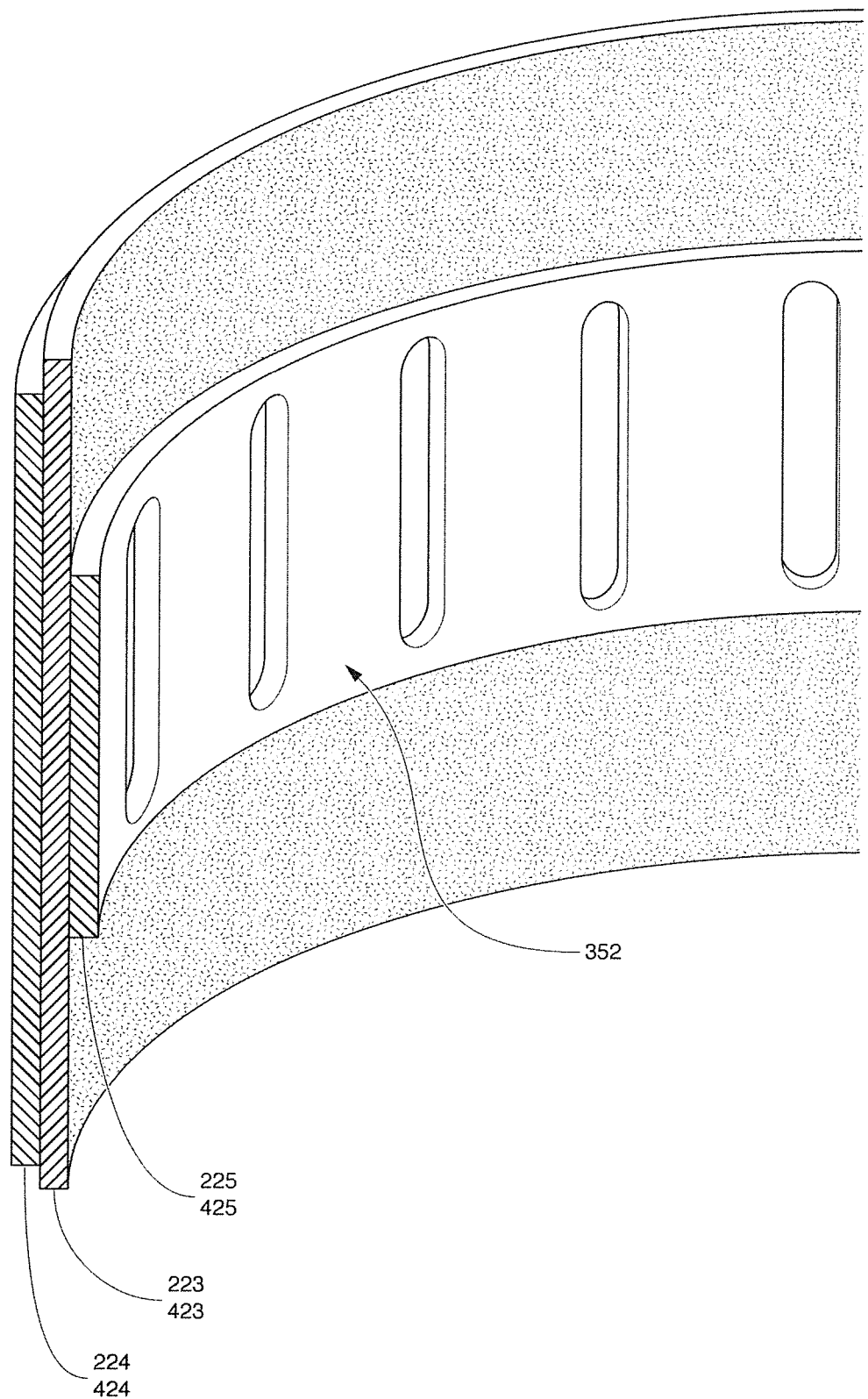
FIG. 6 illustrates a constructive detail concerning the realization of FIGS. 2, 2A and 4.

According to a further embodiment, see FIGS. 2, 2A, 4, 6, 7_7A, 8_8A, said tubular body, 220/420, and/or said septum, 130/230, can further comprise the through holes, 251 252 and 253 in FIG. 2, 251A 252A 253 and 253A in FIG. 2A, 451 and 452 in FIG. 4, in which said through holes have width such as to allow the passage of resin 140/240/340/440 in its liquid/pasty state through the same pass-through holes during the casting operations of the same resin for forming the system/sensor.

Figure 7:
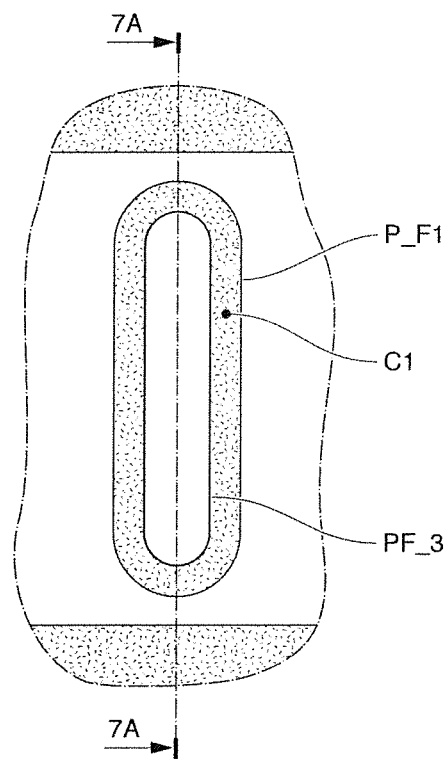
FIGS. 7, 7A, 8 and 8A illustrate a constructive detail concerning the realization of FIGS. 2, 2A and 4.
Figure 7A:
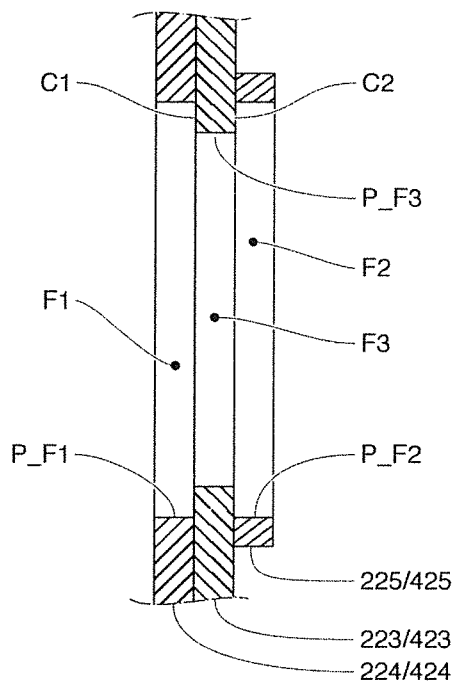
Figure 8:
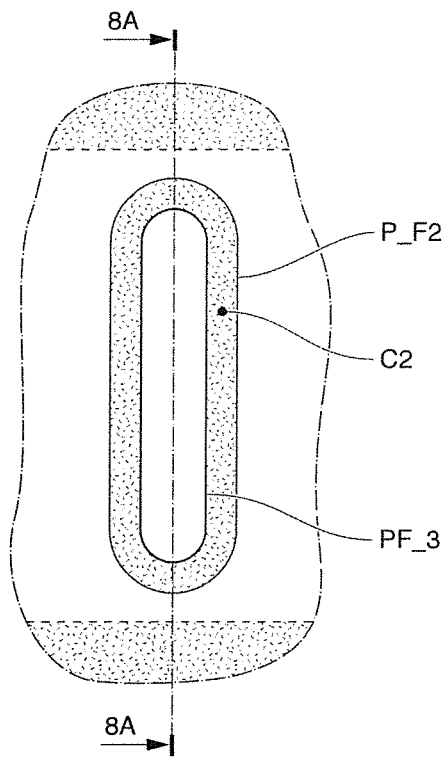
Figure 8A:
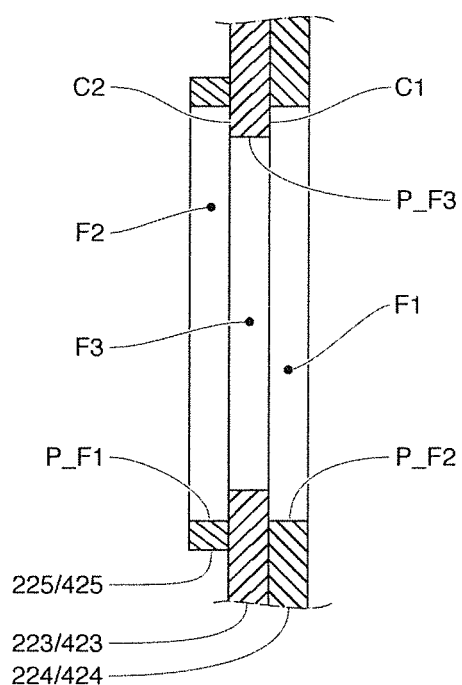

With particular reference to FIGS. 7_7A and 8_8A, preferably, said through holes, 251 252 and 253 in FIG. 2, 251A 252A 253 and 253A in FIG. 2A, 451 and 452 in FIG. 4, each comprise at least one first hole, F1/F2, made in a layer of conductive material, 223/231/423, and at least a second hole, F3, made in a layer of insulating laminar material, 123/231/423, wherein said first F1/F2 and said second hole F3 are axially aligned with each other.

The first hole F1/F2 has a first amplitude defined by a first perimeter P_F1/P_F2 and said second hole F3 has a second amplitude defined by a second perimeter P_F3, wherein said first hole F1/F2 has a greater amplitude with respect to the second hole F3.

The first hole F1/F2 has a larger amplitude with respect to the second hole F3 and therefore, between the perpendix P_F1/P_F2 of said first hole F1/F2 and the perpendix P_F3 of the second hole F3 a zone C1/C2 is formed in the manner of a annulus having an annular form of insulating laminar material 123/231/423, wherein in said annular zone C1/C2 there is no layer of conductive material 223/231/423.

As described above, said first thin layer 124/224/324/424 of conductive material applied to the outer surface of said self-bearing tubular laminar element 123/223/323/423 and/or said fourth thin layer 133/233 of conductive material applied on the distal surface of said second self-supporting lamina 131/231 is/are grounded, in order to shield the electric field sensor 125/225/325/425/132/232 with respect to the field lines generated by live conductors positioned outside respect to the capacitive sensor object of the present system, in such a way that only the field lines generated by the source electrode 110/210/310/410 will be closed on the electric field sensor 125/225/325/425/132/232.

With reference to the figures, by means of the capacitive coupling between the source electrode 110/210/310/410 and the electric field sensor 125/225/325/425/132/232, the electric field generated by said source electrode only is detected 110/210/310/410 and the respretrive signal detected, can be transmitted to a processing device 160/260/360/460 by means of a cable 161/261/361/461 in order, for example, to estimate the value of the voltage of the aforementioned source electrode 110/210/310/410.

With reference to said tubular body 120/220/320/420, it is preferably obtained by means of a flat double-sided copper base (copper-plated fiberglass), in which, in a flat configuration, the layers of conductive material of said copper base have been carved with the photoengraving or mechanical milling technique, in order to obtain the desired conformation for the two copper layers and to make any holes, as described above and illustrated in the accompanying drawings, to then bend said flat plate as a tube, and finally insert/position said tubular worked copper base in the system object of the present invention, in a subsequent assembly step which precedes the casting phase of the resin.

With reference to the particular embodiment of FIGS. 2, 2A and 4, during the casting process the resin can pass and flow through the through holes, 251, 252, 251A, 252A, 253, 253A, 451, 452, and in this manner the filling and gripping characteristics in relation to the same resin are improved, so that no vacuoles are formed and no unwanted detachment occurs between the elements that make up the system and the same resin.

With particular reference to the tubular body 120/220/320/420, as said tubular body is made by means of a double-sided copper-plated base (copper-plated glass-like), as specified above, said tubular body 120/220/320/420 assumed inside of the system a pre-packaged monolithic consistency and, therefore, its strength characteristics are improved during the casting operations of the resin and also its resistance at aging during the use of the sensor, also avoiding the formation of vacuoles during the casting as well as the formation of undesired posthumous disconnecting between the elements that comprise said tubular body 120/220/320/420.

The description of the various embodiments of the constructive system for a capacitive sensor is given purely by ways of non-limiting example and therefore all the modifications or variations suggested by the practice and/or within the scope of the following claims can be applied to said system. The following claims are also an integrative part for the above-described description.

The invention claimed is:

1. A capacitive voltage sensor comprising:
   a source electrode extending along a longitudinal axis, the source electrode including a first axial end portion and a second axial end portion opposite the first axial end portion;
   a sleeve extending along the longitudinal axis, the sleeve surrounding the source electrode and including
      a support element made of an insulating material,
      a first layer made of a conductive material and disposed on an outer surface of the support element, the first layer configured as an electrical screen, and
      a second layer made of the conductive material and disposed on an inner surface of the support element facing the source electrode, wherein the second layer and the source electrode define a capacitive coupling; and
   a molded dielectric insulating material encompassing the source electrode and the sleeve.

2. The capacitive voltage sensor of claim 1, wherein the sleeve includes a plurality of through-holes configured to permit the dielectric insulating material to flow through the sleeve during molding.

3. The capacitive voltage sensor of claim 1, wherein the support element electrically isolates the first layer from the second layer.

4. The capacitive voltage sensor of claim 1, wherein the conductive material is copper, and wherein the insulating material is fiberglass.

5. The capacitive voltage sensor of claim 4, wherein the second layer includes a third hole axially aligned with the first hole and the second hole such that the first hole, the second hole, and the third hole collectively define a through-hole through the sleeve, wherein the third hole includes a third perimeter and a third width defined by the third perimeter, and wherein the third width is greater than the second width.

6. The capacitive voltage sensor of claim 1, wherein the first layer includes a first hole, and wherein the support element includes a second hole axially aligned with the first hole.

7. The capacitive voltage sensor of claim 6, wherein the first hole includes a first perimeter and a first width defined by the first perimeter, wherein the second hole includes a second perimeter and a second width defined by the second perimeter, and wherein the first width is greater than the second width such that an annular area of the insulating material is defined between the first perimeter and the second perimeter.

8. The capacitive voltage sensor of claim 1, wherein the support element, the first layer, and the second layer define an interior chamber in which the source electrode is positioned.

9. The capacitive voltage sensor of claim 8, wherein the sleeve includes a wall extending generally transverse to the longitudinal axis, the wall defining an axial end of the interior chamber.

10. The capacitive voltage sensor of claim 9, wherein the wall includes a wall support element made of the insulating material and an inner layer made of the conductive material, the inner layer facing the source electrode.

11. The capacitive voltage sensor of claim 10, wherein the inner layer is grounded.

12. The capacitive voltage sensor of claim 10, wherein the wall includes a plurality of through-holes configured to permit the dielectric insulating material to flow through the wall during molding.

13. The capacitive voltage sensor of claim 10, wherein the wall includes an outer layer opposite the inner layer such that the wall support element is disposed between the outer layer and the inner layer, and wherein the outer layer is made of the conductive material.

14. The capacitive voltage sensor of claim 13, wherein the outer layer is grounded.

15. The capacitive voltage sensor of claim 13, wherein the conductive material is copper.

16. The capacitive voltage sensor of claim 13, wherein the outer layer is in conductive contact with the first layer.

* * * * *